(12) United States Patent
Sheng et al.

(10) Patent No.: US 6,344,365 B1
(45) Date of Patent: Feb. 5, 2002

(54) ARC COATING ON MASK QUARTZ PLATE TO AVOID ALIGNMENT ERROR ON STEPPER OR SCANNER

(75) Inventors: Han-Ming Sheng, Hsin-Chu; Cheng-Chen Kuo, Kaohsiung, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/578,411

(22) Filed: May 26, 2000

(51) Int. Cl.[7] .......................... G01R 21/66; H01L 21/00
(52) U.S. Cl. ........................ 438/16; 438/16; 438/29; 438/48; 438/69; 438/72; 257/21; 257/184; 257/431; 356/152.2; 356/445; 359/197; 359/537; 359/538
(58) Field of Search .................. 438/16, 29, 48–54, 438/69–72; 257/21, 184, 431; 356/445, 369, 152–152.2; 359/197, 537–538, 629–638

(56) References Cited

U.S. PATENT DOCUMENTS

| 4,450,201 A | * | 5/1984 | Brill et al. ................. 428/336 |
| 4,530,891 A | | 7/1985 | Nagarekawa et al. ......... 430/5 |
| 4,764,441 A | | 8/1988 | Ohta et al. ...................... 430/5 |
| 4,873,163 A | | 10/1989 | Watakabe et al. ............... 430/5 |
| 5,194,345 A | | 3/1993 | Rolfson .......................... 430/5 |
| 5,279,911 A | | 1/1994 | Kamon et al. .................. 430/5 |
| 5,472,811 A | | 12/1995 | Vasudev et al. ................ 430/5 |
| 5,553,110 A | | 9/1996 | Sentoku et al. ................ 378/35 |
| 5,592,317 A | * | 1/1997 | Fujikawa et al. ........... 349/110 |
| 5,966,242 A | * | 4/1997 | Yamanaka ................... 359/618 |
| 5,780,161 A | | 7/1998 | Hsu .............................. 428/426 |
| 6,027,815 A | * | 2/2000 | Hsu .............................. 428/426 |
| 6,096,571 A | * | 8/2000 | New et al. ..................... 438/29 |
| 6,165,598 A | * | 12/2000 | Nelson ......................... 428/212 |
| 6,218,292 B1 | * | 4/2001 | Foote ........................... 438/636 |

FOREIGN PATENT DOCUMENTS

JP 6-292643 * 12/1986 ............. G03F/1/00

* cited by examiner

*Primary Examiner*—Matthew Smith
*Assistant Examiner*—Granvill D. Lee, Jr.
(74) *Attorney, Agent, or Firm*—George O. Saile; Stephen B. Ackerman

(57) ABSTRACT

A new method and apparatus is provide whereby light diffusion within the light measurement toll has been eliminated. A layer of Anti Reflective Coating is deposited on the outside of the second surface of a quartz mask thereby preventing light that is reflected internally to the quartz mask from exiting the mask. All reflected light is therefor eliminated and, with that, the source of light diffusion is eliminated.

14 Claims, 1 Drawing Sheet

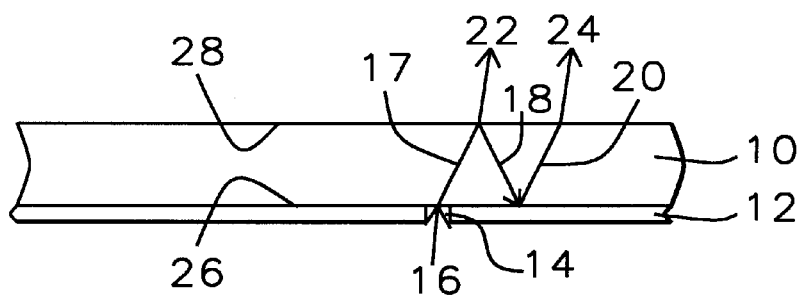
FIG. 1 - Prior Art
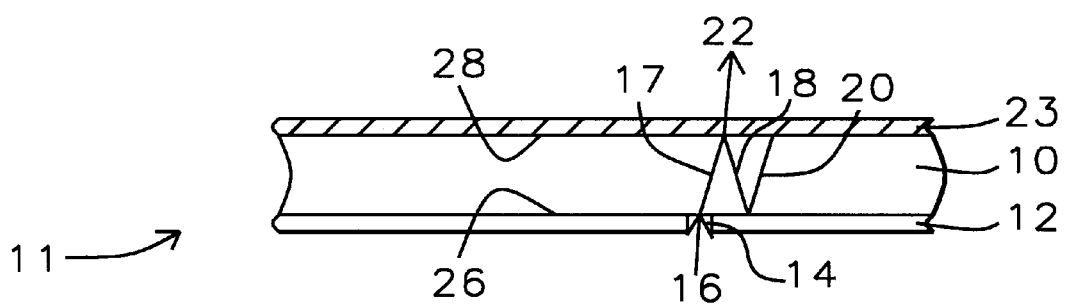
FIG. 2

ARC COATING ON MASK QUARTZ PLATE TO AVOID ALIGNMENT ERROR ON STEPPER OR SCANNER

BACKGROUND OF THE INVENTION (1) Field of the Invention

The invention relates to the fabrication of integrated circuit devices, and more particularly, to a method and apparatus that allows for the elimination of alignment errors of the photolithographic mask that is used by wafer stepper or scanner tools.

(2) Description of the Prior Art

The traditional use of masks in the process of creating semiconductor devices relates to the creation of highly repetitive patterns in semiconductor surfaces. These surfaces are most notably the surfaces of layers of photoresist wherein a pattern is created based on a pattern that is present in a photolithographic mask. The pattern in the layer of photoresist is used to create a pattern in an underlying layer of for instance insulation material, dielectric, metal, and the like. Masks are however not only used for the purpose of etching layers of semiconductor material but can, in addition, be used to manipulate light for purposes of wafer alignment during the process of creating semiconductor devices. One such application is the use of a mask in wafer stepper and scanner tools. One of the important sub-functions of a wafer stepper tool is to align the wafer before a next layer of material is exposed on the wafer. This alignment function is based on placing a wafer marker in an exact location and adjusting the position of the wafer to the point where the wafer is in the exact and desired location. To accomplish this, a laser beam is aimed at a marker that is provided for this purpose on the surface of the wafer. This marker is a reference point that is used to adjust the exact location of the wafer. Incident light is reflected from the surface of the alignment marker, resulting in a diffracted light beam. The diffracted light passes through an opening (lens) that is formed in a layer of chrome, the layer of chrome is the incident surface of a quartz mask. The light passes through the quartz mask and is observed and measured as an indication of the alignment of the wafer.

A problem that can arise with this approach is caused by light that does not strike a surface under an exact angle of 90 degrees, where the surface is a surface of an object that has a thickness that is comparable with the wavelength of the incident light. The diffracted light passes through two physical entities before it is analyzed. The first entity is a layer of chrome that has been deposited on the surface of the second entity and in which an opening (lens) has been created for the diffracted light to pass through. Because the chrome has been laterally removed over a measurable distance and along a first surface of the second entity, the diffracted light does not pass through any surfaces of the layer of chrome. The diffracted light enters the second entity, a quartz mask with a certain thickness, through a first surface and exits the second entity through a second surface whereby both surfaces are parallel to each other. The thickness of quartz mask is large enough (compared with the wavelength of the incident light) that light will be reflected from the second surface of the quartz mask if the diffracted light does not strike this surface under an angle of 90 degrees. Diffracted light that is reflected by the second surface of the quartz mask will be directed back at the first surface from which the light will again be reflected back to the second surface causing a diffusion of light to occur throughout the body of the quartz mask. The reflection of the diffracted light that occurs by the second surface of the quartz mask will be a partial reflection, with some of the light that strikes the second surface of the quartz mask penetrating this mask and emerging from the second surface of the quartz mask as a so-called reflection beam of light. The same can be observed regarding the original or incident beam of light that strikes the second surface of the quartz mask, a portion of the incident light beam will penetrate through the second surface of the quartz mask and emerge from that surface as an incident beam of light. The incident light beam that passes through the second surface of the quartz mask has traveled a distance that is shorter than the distance that is traveled by the light beams that are reflected by the second surface of the quartz mask. The intensity of the incident light beam will therefore be highest, the adjacent light that emerges from the second surface of the quartz mask and that is created by reflections of light between the first and the second surfaces of the quartz mask progressively decreases in intensity, a decrease that is proportional to the distance between the incident light (that passed through the second surface of the quartz mask without being reflected internally to the quartz mask) and the reflected light (that passed through the second surface of the quartz mask after having been reflected internally between the two surfaces of the quartz mask). It is therefore clear that the light that is reflected by the wafer mark for wafer alignment is, after it has passed through the chrome lens/quartz mask arrangement, is highly diffused making exact alignment of the wafer difficult to accomplish.

It must be observed that the above indicated problems of reflected light (between the first and the second surfaces of the quartz mask) are only present if the diffracted light (that impacts the first surface of the quartz mask as incident refracted light) impacts this surface under an angle that is other than 90 degrees. It is, for practical tool arrangements such as wafer steppers and scanners, very difficult to the point of being impossible to assure that the angle of incidence is exactly 90 degrees. For actual tool applications the phenomenon of light diffusion will therefore be an ever present distracter resulting in errors in wafer alignment that can be as large as 100 nm. This error in wafer alignment is not acceptable in a semiconductor manufacturing environment, a method must therefore be sought that eliminates the above highlighted reasons and source of the wafer misalignment. The invention provides such a method.

FIG. 1 shows a cross section of the quartz mask of Prior Art whereby the highlighted items are the following, all of these items having been previously described:

10 is the body of the quartz mask 12 is the layer of chrome that has been deposited on the first surface 26 of the quartz mask 10

14 is the opening or lens that has been created in the layer 12 of chrome for passage of the diffracted light 16 is the light that is diffracted by the wafer mark that is provided on the surface of the wafer and that is used for wafer alignment in the wafer stepper or wafer scanner tool 17 is the diffracted light after the light enters into the quartz mask 10

18 is the portion of the diffracted light 17 that is reflected by the second surface 28 of the quartz mask 10

20 is the portion of the reflected light 18 light that is reflected by the first surface 26 of the quartz mask 10

22 is the portion of the incident light 17 passes through the second surface of the quartz mask 10 and that emerges from the quartz mask 10, and 24 is the portion of the reflected light 20 that passes through the second surface of the quartz mask 10 and that emerges from the quartz mask 10.

It must be observed, as previously stated, that the light intensity of light beam 24 is less than the light intensity of light beam 22 causing diffusion of the light that is reflected by the wafer mark and that is available for measuring wafer alignment.

U.S. Pat. No. 4,873,163 (Watakabe et al.) teaches a photomask with an ARC (low reflective layer) on top.

U.S. Pat. No. 5,279,911 (Kamon et al.) shows a photomask with a ARC 13 on the backside.

U.S. Pat. No. 5,194,345 (Rolfson) shows a phase shift mask (PSM).

U.S. Pat. No. 5,553,110 (Sentok et al.) discloses an x-ray mask with an ARC (e.g. light scattering prevention film) layer.

U.S. Pat. No. 4,764,441 (Ohta et al.) teaches a photomask with a multilayer non-transmissive film.

U.S. Pat. No. 4,530,891 (Nagaredawa) shows an ARC layer on the Cr layer. However, these references differ from exact process of the invention.

U.S. Pat. No. 5,472,811 (Vasudev et al.) teaches a PSM with a multi-layered ARC optical coating to reduce reflections.

SUMMARY OF THE INVENTION

A principle objective of the invention is to provide a method and apparatus for improved and exact wafer alignment.

Another objective of the invention is to provide a method and apparatus for wafer alignment where impact of light diffusion as part of the light analysis tool has been eliminated.

In accordance with the objectives of the invention a new method and apparatus is provided whereby light diffusion within the light measurement tool has been eliminated. A layer of Anti Reflective Coating is deposited on the outside of the second surface of a quartz mask thereby preventing light that is reflected internally to the quartz mask from exiting the mask. All reflected light is therefore eliminated and, with that, the source of light diffusion is eliminated.

BRIEF DESCRIPTION OF THE DRAWINGS

FIG. 1 shows a cross section of a quartz mask of the Prior Art.

FIG. 2 shows the cross section of the quartz mask of the invention.

DESCRIPTION OF THE PREFERRED EMBODIMENTS

1) Referring now specifically to FIG. 2, there is shown a cross section of the light analysis tool 11 of the invention comprising a quartz mask 10 whereby a layer 23 of ARC has been deposited on the second surface 28 of the quartz mask 10. The highlighted items in FIG. 2 can be summarized as follows:

10 is the body of the quartz mask 12 is the layer of chrome that has been deposited on the first surface 26 of the quartz mask 10

14 is the opening or lens that has been created in the layer 12 of chrome for passage of the diffracted light 16 is the light that is diffracted by the wafer mark that is provided on the surface of the wafer and that is used for wafer alignment in the wafer stepper or wafer scanner tool 17 is the diffracted light after the light enters into quartz mask 10

18 is the portion of the diffracted light 17 that is reflected by the second surface 28 of the quartz mask 10

20 is the portion of the reflected light 18 light that is reflected by the first surface 26 of the quartz mask 10

22 is the portion of the incident light 17 passes through the second surface 28 of the quartz mask 10 and that emerges from the quartz mask 10

23 is a layer of ARC that has been deposited on the second surface 28 of the quartz mask 10

26 is the first surface of the quartz mask 10, and 28 is the second surface of the quartz mask 10.

The alignment beam 16 typically uses a laser source with for instance HeNe as source material at a wavelength of 632.8 nm.

Comparing the cross sections that are shown under FIG. 1 and FIG. 2, it is obvious that the difference between the two cross sections is that light 24 is present in FIG. 1 whereas this light is not present in the cross section that is shown in FIG. 2. The reason is obvious: this light (24, FIG. 1) is suppressed by the layer 23 of ARC (FIG. 2) that has been deposited on the second surface 28 of the quartz mask 10.

The development of ARC has largely been stimulated by the semiconductor industry's continuing drive toward integrated circuits with ever decreasing device geometries. The decrease in device geometries, coupled with the pervasive use of highly reflective materials such as polysilicon, aluminum and metal silicides, has led to photolithographic patterning problems. Unwanted light reflections that are introduced by underlying reflective materials during the photoresist patterning process often cause the resulting photoresist pattern to be distorted.

Anti-reflective coatings (ARC's) have been developed to minimize the adverse impact due to reflectance from these reflective materials. In many instances, these ARC's are conductive materials which are deposited as a blanket layer on top of metal and simultaneously patterned with the metal to form interconnects.

Some dielectric ARC's, such as silicon rich silicon nitride or aluminum nitride, are most suitable for deep ultraviolet (DUV) radiation. The vast majority of photolithography steps occur at higher wave lengths, such as I-line or G-line exposures, where silicon rich silicon nitride or aluminum nitride are not optimal materials to be used for ARC's.

In typical applications an anti-reflective coating (ARC layer) is used for covering the surface of an underlying layer; an ARC is typically formed over an aluminum layer prior to coating with photoresist. The ARC is used to reduce deleterious effects resulting from undesired reflection of the UV light used to expose the photoresist layer. A common ARC is TiN which may be conveniently deposited overlying the deposited aluminum layer by sputtering in the same machine that is used to apply the aluminum, aluminum (or an aluminum alloy), or a barrier material (such as metal, metal compound or silicide). A typical ARC coating is between about 300 and 1500 angstrom thick, and more preferably 1400 angstrom thick, Possible materials that can be used for the ARC layer of the invention are cryolite and MgF, the selection of the material that is used for the layer of ARC however depends on the frequency of the light that is used to perform the wafer alignment procedure. It must thereby also be realized that the layer of ARC can contain more than one layer of material, this again is dependent on the particular application in which the wafer marker is used to align the wafer. It is thereby well known in the art that, for multiple layers of ARC, each of the layer interfaces reflects a portion of the incident light while a portion of the light also penetrates the interface. From this it is clear that the light suppressing capabilities of the composite layer of ARC can be well controlled and designed for particular applications.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A apparatus for evaluating wafer alignment, comprising:
   a quartz mask said mask having a first and a second surface whereby said first surface is parallel with said second surface and separated from said second surface by a measurable distance;
   a thin layer of chrome deposited over said first surface of said quartz mask whereby an opening has been provided in said layer of chrome said opening to function as a lens for passage of incident light, and
   a layer of Anti Reflective Coating deposited over said second surface of said quartz mask.

2. The apparatus of claim 1 wherein said incident light is a laser light beam with a wavelength of 632.8 nm.

3. The apparatus of claim 1 wherein said layer of Anti Reflective Coating contains silicon rich silicon nitride sputter deposited to a thickness between about 300 and 1500 angstrom thick, and more preferably 1400 angstrom thick.

4. The apparatus of claim 1 wherein said layer of Anti Reflective Coating contains titanium nitride sputter deposited to a thickness between about 300 and 1500 angstrom thick, and more preferably 1400 angstrom thick.

5. The apparatus of claim 1 wherein said layer of Anti Reflective Coating contains cryolite sputter deposited to a thickness between about 300 and 1500 angstrom thick, and more preferably 1400 angstrom thick.

6. The apparatus of claim 1 wherein said layer of Anti Reflective Coating contains $MgF_2$ sputter deposited to a thickness between about 300 and 1500 angstrom thick, and more preferably 1400 angstrom thick.

7. The apparatus of claim 1 wherein said layer of Anti Reflective Coating contains multiple layers of Anti Reflective Coating material deposited to a thickness between about 300 and 1500 angstrom thick, and more preferably 1400 angstrom thick.

8. A method for evaluating wafer alignment, comprising:
   (a) providing a semiconductor substrate having a surface whereby said substrate has been provided with an alignment mark on said surface of said substrate;
   (b) directing a beam of light at said alignment mark of said substrate;
   (c) intercepting light that is reflected by said alignment mark by passing said reflected light through a light analysis tool, said light analysis tool comprising;
      (i) a quartz mask, said mask having a first and a second surface, whereby said first surface is parallel with said second surface and separated from said second surface by a measurable distance;
      (ii) a thin layer of chrome deposited over said first surface of said quartz mask, whereby an opening has been provided in said layer of chrome, said opening functioning as a lens for said passing of said incident light; and
      (iii) a layer of Anti Reflective Coating deposited over said second surface of said quartz mask;
   (d) analyzing said reflected light for alignment of said alignment mark; and
   (e) correcting misalignment of said substrate.

9. The method of claim 8 wherein said incident light is a laser light beam with a wavelength of 632.8 nm.

10. The method of claim 8 a wherein said layer of Anti Reflective Coating contains silicon rich silicon nitride sputter deposited to a thickness between about 300 and 1500 angstrom thick, and more preferably 1400 angstrom thick.

11. The method of claim 8 a wherein said layer of Anti Reflective Coating contains titanium nitride sputter deposited to a thickness between about 300 and 1500 angstrom thick, and more Preferably 1400 angstrom thick.

12. The method of claim 8 wherein said layer of Anti Reflective Coating contains cryolite sputter deposited to a thickness between about 300 and 1500 angstrom thick, and more preferably 1400 angstrom thick.

13. The method of claim 8 wherein said layer of Anti Reflective Coating contains $MgF_2$ sputter deposited to a thickness between about 300 and 1500 angstrom thick, and more preferably 1400 angstrom thick.

14. The method of claim 8 wherein said layer of Anti Reflective Coating contains multiple layers of Anti Reflective Coating material deposited to a thickness between about 300 and 1500 angstrom thick, and more preferably 1400 angstrom thick.

\* \* \* \* \*